(12) United States Patent
O'Donnell et al.

(10) Patent No.: US 8,085,177 B2
(45) Date of Patent: Dec. 27, 2011

(54) DIGITAL TO ANALOG CONVERTER SYSTEM AND METHOD WITH MULTI-LEVEL SCRAMBLING

(75) Inventors: John Jude O'Donnell, Clare (IE); Frederick Carnegie Thompson, Limerick (IE)

(73) Assignee: MediaTek Singapore Pte. Ltd., Singapore (SG)

( * ) Notice: Subject to any disclaimer, the term of this patent is extended or adjusted under 35 U.S.C. 154(b) by 252 days.

(21) Appl. No.: 12/624,413

(22) Filed: Nov. 24, 2009

(65) Prior Publication Data

US 2011/0069840 A1 Mar. 24, 2011

Related U.S. Application Data

(60) Provisional application No. 61/244,497, filed on Sep. 22, 2009.

(51) Int. Cl.
*H03M 1/66* (2006.01)
(52) U.S. Cl. ........... 341/144; 341/61; 341/141; 375/315
(58) Field of Classification Search .............. 341/50–70, 341/140–150; 375/315
See application file for complete search history.

(56) References Cited

U.S. PATENT DOCUMENTS

| | | | |
|---|---|---|---|
| 4,775,985 A * | 10/1988 | Busby | 341/95 |
| 6,614,377 B1 | 9/2003 | Adams | |
| 7,079,063 B1 * | 7/2006 | Nguyen et al. | 341/144 |
| 7,812,753 B1 * | 10/2010 | Myles et al. | 341/144 |
| 7,994,957 B2 * | 8/2011 | O'Donnell et al. | 341/144 |
| 2003/0197633 A1 | 10/2003 | Adams | |
| 2010/0245142 A1 * | 9/2010 | Myles et al. | 341/133 |
| 2010/0328124 A1 * | 12/2010 | O'Donnell et al. | 341/143 |

OTHER PUBLICATIONS

Khiem Nguyen et al., A 108 dB SNR, 1.1 mW Oversampling Audio DAC With a Three-level DEM Technique, IEEE Journal of Solid-State Circuits, vol. 43, No. 12, Dec. 2008, p. 2592-p. 2600.
K. Ola Andersson et al., Dynamic Element Matching in Decomposed Digital-to-Analog Converters, Norchip Conference 2004, Nov. 8-9, 2004, p. 187-p. 190.
International application No. PCT/SG2010/000355, International filing date:Sep. 22, 2010, International Searching Report mailing date: Jun. 30, 2011.

* cited by examiner

*Primary Examiner* — Lam T Mai
(74) *Attorney, Agent, or Firm* — Winston Hsu; Scott Margo

(57) ABSTRACT

Tri-level scrambling in a digital to analog converter system is achieved by, in response to a tri-level binary code input, disabling a negative data directed scrambler circuit when the input code is in the positive cycle portion, disabling a positive data directed scrambler circuit when the input code is in the negative cycle portion and disabling both scrambler circuits upon a zero input code for reducing low level distortion due to a reversal of current during crossover between those cycles.

9 Claims, 11 Drawing Sheets

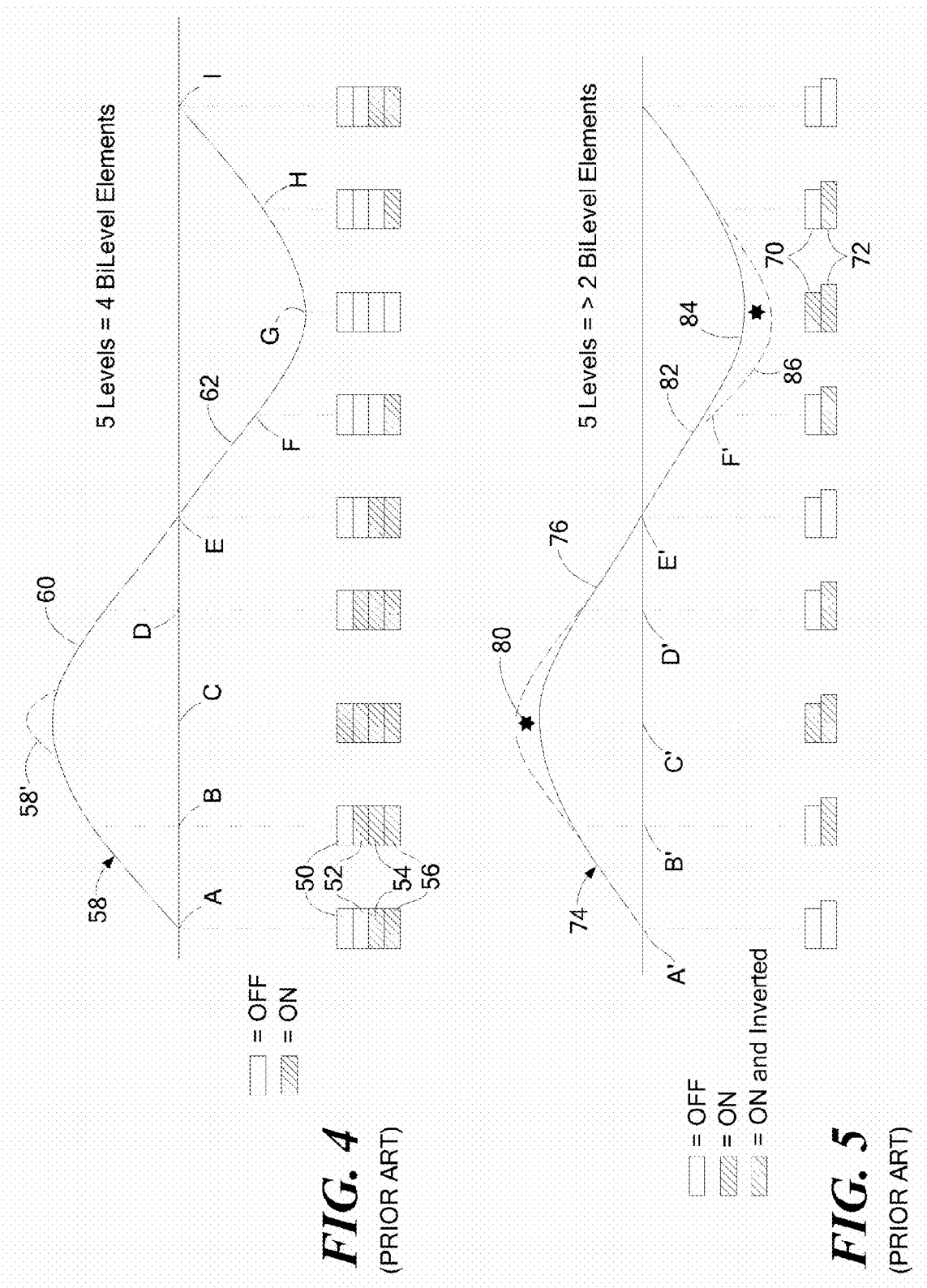

Table I

| State | Ain | Bin | Aout | Bout | NewState |
|---|---|---|---|---|---|
| X | 0 | 0 | 0 | 0 | State |
| X | +1 | +1 | +1 | +1 | State |
| X | -1 | -1 | -1 | -1 | State |
| 0 | +1 | 0 | +1 | 0 | 1 |
| 0 | 0 | +1 | 0 | +1 | 2 |
| 0 | -1 | 0 | -1 | 0 | 1 |
| 0 | 0 | -1 | 0 | -1 | 2 |
| 1 | +1 | 0 | 0 | +1 | 0 |
| 1 | 0 | +1 | +1 | 0 | 0 |
| 1 | -1 | 0 | 0 | -1 | 0 |
| 1 | 0 | -1 | -1 | 0 | 0 |
| 2 | +1 | 0 | +1 | 0 | 0 |
| 2 | 0 | +1 | 0 | +1 | 0 |
| 2 | -1 | 0 | -1 | 0 | 0 |
| 2 | 0 | -1 | 0 | -1 | 0 |

112 — Data is unswappable => No State Change

114 — State0 => Don't swap but advance State

116 — State1 => Output in 1st predetermined Order and return to State 0

118 — State2 => Output in 2nd predetermined Order and return to State 0

*FIG. 7*
(PRIOR ART)

Table II

| StateP (170) | StateN (172) | Ain (102a) | Bin (104a) | Aout (106a) | Bout (108a) | NewStateP (174) | NewStateN (176) |
|---|---|---|---|---|---|---|---|
| X | X | 0 | 0 | 0 | 0 | StateP | StateN |
| X | X | +1 | +1 | +1 | +1 | StateP | StateN |
| X | X | -1 | -1 | -1 | -1 | StateP | StateN |
| 0 | X(2) | +1 | 0 | +1 | 0 | 1 | StateN(2) |
| 0 | X | 0 | +1 | 0 | +1 | 2 | StateN |
| X | 0 | -1 | 0 | -1 | 0 | StateP | 2 |
| X | 0 | 0 | -1 | 0 | -1 | StateP | 1 |
| 1 | X(2) | +1 | 0 | 0 | +1 | 0 | StateN |
| 1 | X | 0 | +1 | 0 | +1 | 0 | StateN |
| X | 1 | -1 | 0 | -1 | 0 | StateP | 0 |
| X | 1 | 0 | -1 | -1 | 0 | StateP | 0 |
| 2 | X | +1 | 0 | +1 | 0 | 0 | StateN |
| 2 | X | 0 | +1 | +1 | 0 | 0 | StateN |
| X(0) | 2 | -1 | 0 | 0 | -1 | StateP(0) | 0 |
| X | 2 | 0 | -1 | 0 | -1 | StateP | 0 |

178 — Data is unswappable => No State Change

180 — State0 => Don't swap but advance State

182 — State1 => Output in 1st predetermined Order and return to State 0

184 — State2 => Output in 2nd predetermined Order and return to State 0

*FIG. 10*

DIGITAL TO ANALOG CONVERTER SYSTEM AND METHOD WITH MULTI-LEVEL SCRAMBLING

RELATED APPLICATIONS

This application claims benefit of and priority to U.S. Provisional Application Ser. No. 61/244,497 filed 2009 Sep. 22 under 35 U.S.C. §§119, 120, 363, 365, and 37 C.F.R. §1.55 and §1.78 incorporated herein by this reference.

FIELD OF THE INVENTION

This invention relates to an improved digital to analog converter system and method with multi-level scrambling.

BACKGROUND OF THE INVENTION

The usage of multi-level elements for current steering digital to analog converters (DACs) is a recent innovation which minimizes the amount of noise current switched to the DAC output at low signal levels. A multi-level e.g. tri-level element is similar to a bi-level element (which can be on or off i.e. 1 or 0) except that its output is reversible resulting in three possible levels (−1, 0, +1). Standard thermometer encoding and data directed scrambling techniques are not applicable to a DAC constructed with tri-level elements. A new scheme, patented by Nguyen et al. (U.S. Pat. No. 7,079,063B1) addresses this problem using data directed scrambling. However, this solution doesn't account for the reversal of current source elements during crossover between the positive and negative domains. The result is low level distortion products. The problem results from the elements being scrambled or shuffled without regard to whether they are output in the positive or negative sense.

SUMMARY OF THE INVENTION

It is therefore an object of this invention to provide an improved digital to analog converter system and method with multi-level scrambling.

It is a further object of this invention to provide such an improved digital to analog converter system and method which reduces low level distortion due to reversal of current during crossover between positive and negative cycles or domains.

The invention results from the realization that an improved digital to analog converter system and method with multi-level scrambling which reduces low level distortion due to reversal of current during zero crossover can be achieved by disabling a negative, data directed scrambler circuit when the input code is in the positive cycle portion, disabling a positive data directed scrambler circuit when the input code is in the negative cycle portion; and disabling both scrambler circuits upon a zero input code.

The subject invention, however, in other embodiments, need not achieve all these objectives and the claims hereof should not be limited to structures or methods capable of achieving these objectives.

This invention features a digital to analog converter system with tri-level scrambling including a tri-level scrambler system having a negative data directed scrambler circuit and a positive data directed scrambler circuit and configured to respond to a tri-level binary code input for disabling the negative scrambler circuit when the input code is in the positive cycle portion, disabling the positive scrambler circuit when the input code is in the negative cycle portion and disabling both scrambler circuits upon a zero input code for reducing low level distortion due to a reversal of current during crossover between those cycles.

In preferred embodiments there may be further included a digital to analog converter. The scrambler system may include a scrambler switching circuit responsive to the input code for passing the negative scrambler circuit output to the digital to analog converter during the negative code cycle portion and blocking the positive scrambler circuit output and passing the positive scrambler circuit output to the digital to analog converter during the positive code cycle portion and blocking the negative scrambler circuit output and blocking both scrambler circuit outputs at zero code. There further may be an inverter circuit connected to the output of the digital to analog converter and an output switching circuit responsive to the input code for selectively transmitting the output of the inverter circuit and the digital o analog converter in response to the input code being in the negative or positive cycle portion, respectively. The digital to analog converter may include a ΣΔ modulator with equally weighted elements. The scrambler system may be further configured to remember the state of a disabled scrambler circuit and resume at that state when that scrambler circuit is re-enabled. The scrambler system may include a state machine which operates according to the zero code cross-over logic set forth in Table II, FIG. 10.

The invention also features a method of tri-level scrambling in a digital to analog converter system including in response to a tri-level binary code input, disabling a negative data directed scrambler circuit when the input code is in the positive cycle portion, disabling a positive data directed scrambler circuit when the input code is in the negative cycle portion, and disabling both scrambler circuits upon a zero input code for reducing low level distortion due to a reversal of current during crossover between those cycles.

In preferred embodiment the method may further include remembering the state of a disabled scrambler circuit and ensuring scrambling at that state when that scrambler circuit is re-enabled.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIG. 4 is a graphical illustration of the results of scrambling with bi-level elements;

FIG. 5 is a graphical illustration of the results of scrambling with multi-level elements;

FIG. 7 is a truth table for a prior art data directed scrambler circuit;

FIG. 10 is a truth table for the scrambler system and method of one embodiment of this invention;

DETAILED DESCRIPTION OF THE INVENTION

Figure 1:
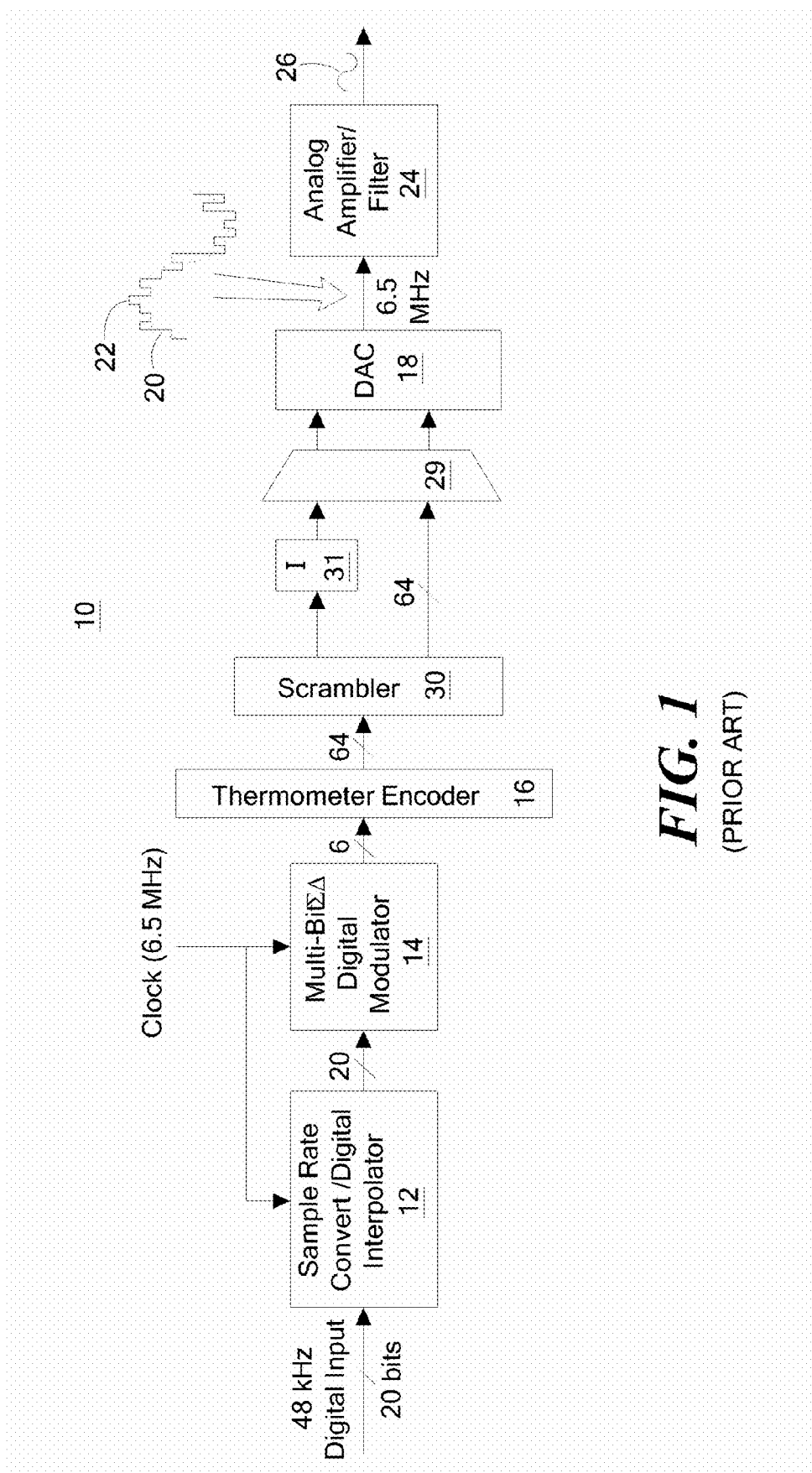
FIG. 1 is a schematic block diagram of a prior art ΣΔ digital to analog converter system with scrambling or shuffling of the input code before input to the digital to analog converter.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 2:
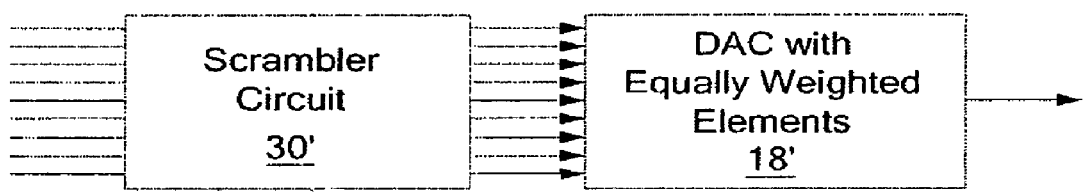
FIG. 2 is a schematic block diagram of a prior art scrambler circuit and digital to analog converter.

There is shown in FIG. 1 a basic $\Sigma\Delta$ digital to analog converter (DAC) 10 with a multi-bit continuous time output stage. A digital input signal, for example at 48 kHz of 20 bits is delivered to sample rate converter and digital interpolator 12 which increases the sampling rate and increases operation to 6.5 MHz, for example. A 6.5 MHz clock also operates a multi-bit $\Sigma\Delta$ digital modulator 14 which receives a 20 bit output from converter interpolator 12 and noise shapes the signal to provide a six bit output to thermometer encoder 16 which in turn provides a 64 bit output, for example, to digital to analog converter (DAC) circuit 18. DAC circuit 18 produces a sine wave 20 with quantizer noise 22 which is removed by analog amplifier/filter 24 to yield a clean sine wave 26. Since analog mismatch causes some levels to be weighted incorrectly a scrambler circuit 30 is used. In a Nguyen type scrambler, (specific to a DAC with tri-level elements) a switching circuit, mux 29 is provided to present to DAC 18 scrambler circuit 30 output in the positive portion of the cycle and the inverted output of scrambler circuit 30 inverted by inverter 31 during the negative portion of the cycle. In systems without scrambling or shuffling the same element (e.g. current source) is used to represent the same portion of the input over and over again preserving any mismatch in a particular portion of the output waveform. With scrambling, different elements or current sources are applied to the same portion of the input. Or, expressed another way the same portion of the input will be supplied by different elements or current sources each time. This is illustrated in FIG. 2 where the thermometer encoded digital input to scrambler circuit 30' has the appearance of a sine wave but after scrambling, the output of scrambler circuit 30' shows the current sources distributed across the input so that no one element or current source is always contributing to the same portion of the input.

Figure 3:
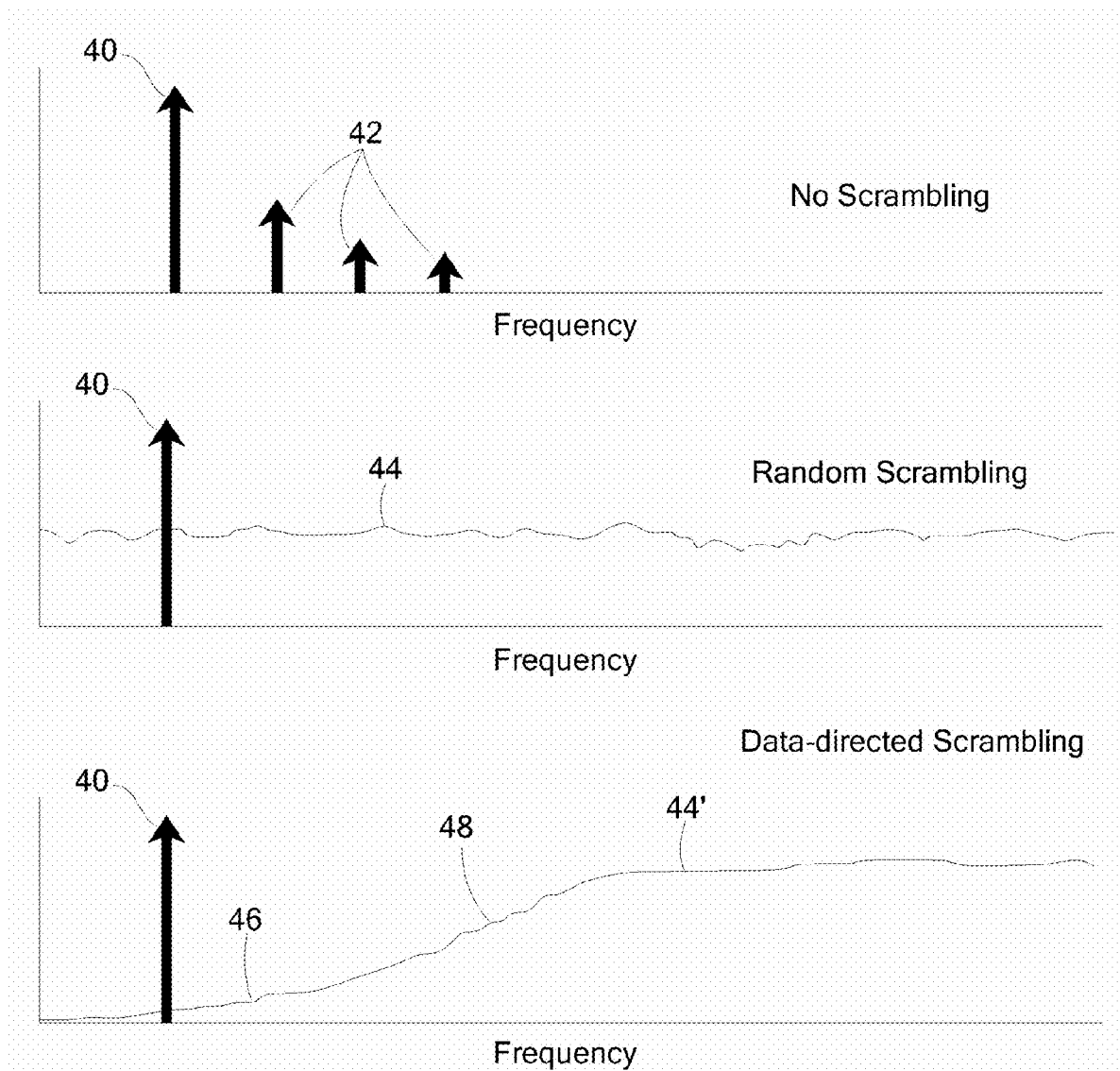
FIG. 3 is a diagram of the in-band and out-of-band noise with and without scrambling and with the data directed sign-incognizant approach of Nguyen et al. U.S. Pat. No. 7,079,063 B1.

Without remapping or scrambling or shuffling the signal 40, FIG. 3, is accompanied by distortion products 42, this distortion is caused by the fact that if one or more elements or current sources are mismatched then the error in the output happens in at the same point in the sine wave each cycle. With random remapping or scrambling the mismatch errors result in white noise 44 which is still significant with relation to the signal 40. The white noise may be shaped so that the noise is out-of-band as at 44' and is much reduced at the in-band area 46. Nguyen et al. U.S. Pat. No. 7,079,063 B1 herein incorporated in its entirety by this reference discloses the application of noise shaped scrambling to tri-level elements. This tri-level data directed scrambling taught by Nguyen et al. is the basic building block of the embodiment of this invention disclosed herein. But it has a shortcoming because at zero crossovers the elements, e.g. current sources are reversed therefore the direction of mismatch is also reversed and so the first order noise shaping breaks down at the zero cross over points.

The problem may be better understood with reference to FIGS. 4 and 5. FIG. 4 uses four bi-level elements 50, 52, 54, and 56 which represent five levels to construct sine wave 58. Assume for the sake of the example that bi-level element 50 is mismatched and the other three 52, 54, and 56 are perfect. Assume again that element 50 provides more current than it should. Since element 50 is only on at point C distortions from it only occur at point C where a slight increase 58' is depicted through the rest of the positive half cycle 60. In the negative half cycle 62, element 50 has no effect. Since the error is always positive it is averaged and can be shifted out-of-band or noise shaped. Thus classic, noise shaped scrambling works adequately for bi-level elements. However, for tri-level elements as taught by Nguyen et al. this does not work well. In Nguyen et al. data directed scrambling of five levels may be represented, for example, with two tri-level elements 70, 72 to provide sine wave 74. Assuming for the sake of the example that element or current source 70 is providing less current than it should. It has no effect at points A', B', D', E' in the positive portion 76 of sine wave 74. But it does have an effect at point C'. Because the lower current from element 70 results in sine wave 74 being flattened in the area 78 whereas it should be more peaked as indicated by phantom line 80. After the zero crossover point E', element 70 effects the outcome again in the negative portion 82 where once again its smaller current contribution distorts sine wave 74 to a flatter profile 84 whereas it should be more peaked as at 86. However, unlike the case with sine wave 58, in FIG. 4, sine wave 74 in FIG. 5 has the mismatch error reversed in the negative portion 82 with respect to the positive portion 76. Thus the first order shaping breaks down at zero crossover. This inversion of the application of the outputs of elements 70 and 72 is accomplished in Nguyen et al. by the use, for example, of inverter 31 at the output of DAC circuit 18 so that mux 29 is provided with the DAC output and an inverted DAC output and chooses the DAC output to deliver in the positive portion of the cycle and the inverter output to deliver during the negative portion of the cycle.

Figure 6:
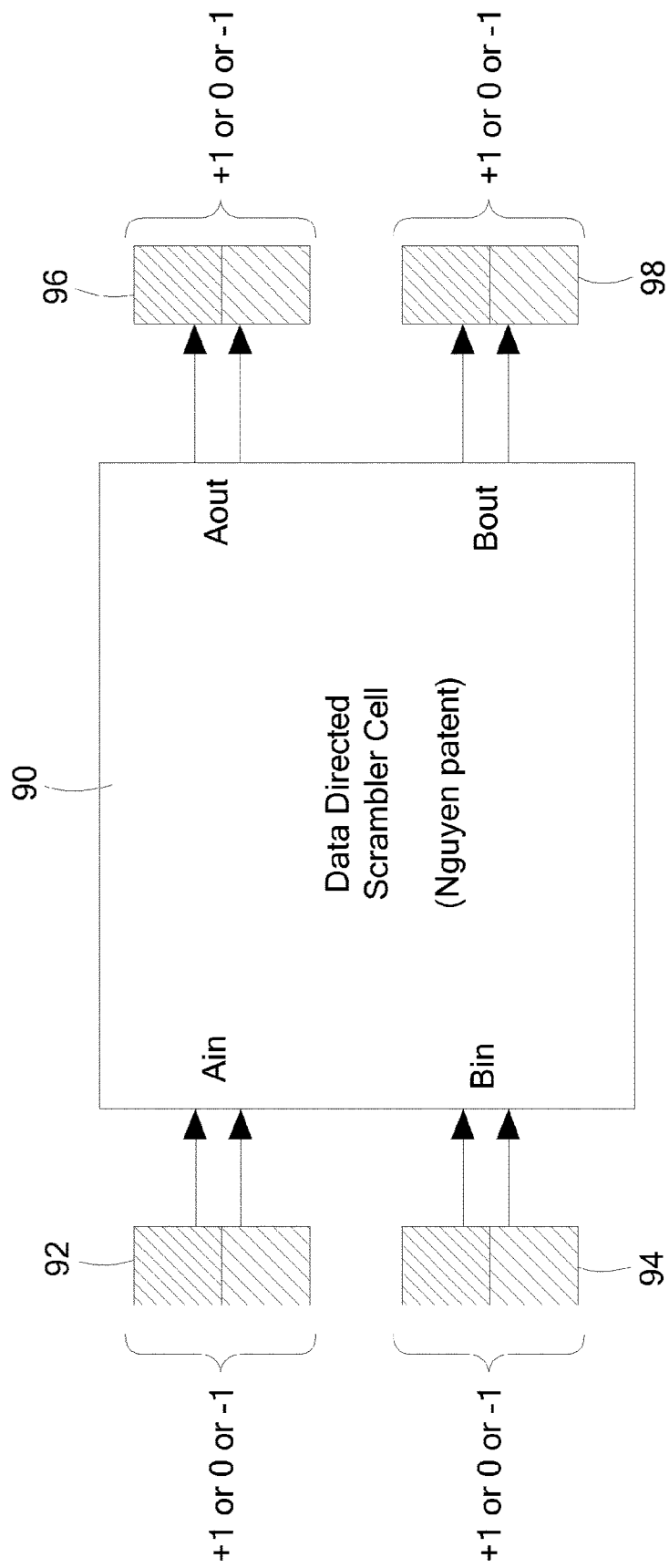
FIG. 6 is a schematic diagram of a scrambler cell used in tri-level data directed scrambler circuits.

A typical scrambling cell 90, FIG. 6, as used in data directed scramblers and which may be used in the Nguyen et al. scrambler U.S. Pat. No. 7,079,063 B1 includes two multi-level, in this case tri-level, inputs 92, 94 at $A_{in}$, $B_{in}$. Those inputs can be +1 or 0 or −1 as shown. Cell 90 likewise has two multi-level outputs 96, 98 at $A_{out}$ and $B_{out}$ which also may be +1 or 0 or −1.

The operation of the prior art scrambler is shown with respect to Table 1, FIG. 7, which includes a number of columns. State column 100, input columns $A_{in}$ 102, $B_{in}$ 104, output columns $A_{out}$ 106, $B_{out}$ 108 and the state column 110. In the group of first three rows 112 the data is un-swappable and there is no state change. The X in state column 100 indicates that the state is of no concern and word "state" in column 110 indicates that this state will remain whatever it was. That the data is un-swappable can be seen from the fact that when the inputs are the same, that is $A_{in}$ and $B_{in}$ are either 0 and 0; +1 and +1; or −1 and −1 then the outputs $A_{out}$ and $B_{out}$ will be the same 0 and 0; +1 and +1; or −1 and −1, all respectively. There is no swap, just a straight pass through. In state 0 as shown by the group of rows 114 there is no swap but the state is advanced, thus whatever the input is on $A_{in}$ and $B_{in}$ in rows 114, the output on $A_{out}$ and $B_{out}$ will be the same. When the input is +1 and 0 there will be a new state, the new state will be state 1. When the input is 0 and +1 the new state will be state 2. Similarly when the input is −1 and 0 the new state will be 1 and when the input is 0 and −1 the new state will be 2. In state 1, group of rows 116, the output is always in the first predetermined order regardless of what the input is and the system is returned to state zero in each case. Thus, whether $A_{in}$ and $B_{in}$ are +1, and 0 or 0 and +1 the output will always be 0 and +1. If the input is $A_{in}$=+1, $B_{in}$=0 there is a swap because the output is $A_{out}$=0, $B_{out}$=+1, whereas if the input as shown in the second row is $A_{in}$=0, $B_{in}$=+1, there is no swap as the output is same $A_{out}$=0, $B_{out}$=+1. The same is true for the remaining two rows in group 116 where the inputs can be $A_{in}$=−1, $B_{in}$=0 or $A_{in}$=0, $B_{in}$=−1. In state 2, group 118, the output is always in the second predetermined order and the system is returned to state 0. Thus, the outputs in state 2, group 118, for the positive portion is always +1 and 0 as indicated in the first two rows and in the negative portion is always 0 and −1 as indicated in the last two rows. Thus, if the input is $A_{in}$=+1, $B_{in}$=0, the output will be $A_{out}$=+1, $B_{out}$=0 and there is no swap, whereas if the input is $A_{in}$=0, $B_{in}$=+1 there is a swap because the output is $A_{out}$=+1, $B_{out}$=0. The same is so for the negative portion of the cycle as shown in the last two rows where the predetermined output order is always 0 and −1.

In operation, assuming an input in state 0, the first row of group 114 having an input $A_{in}$=+1 and $B_{in}$=0 the output will be $A_{out}$=+1, $B_{out}$=0, and the system is then referred to state 1. Referring now to group 116 and assuming an input now exists of $A_{in}$=+1 and $B_{in}$=0 the output will be $A_{out}$=0, $B_{out}$=+1; a swap has occurred and the system will be returned to state 0. Back in state 0 with group 114 assuming an input of $A_{in}$=0, $B_{in}$=−1, for example, the output will be $A_{out}$=0, $B_{out}$=−1; no swap, but now the system goes to state 2. In state 2, group 118, assume an input of $A_{in}$=0, $B_{in}$=+1, the output will be $A_{out}$=+1, $B_{out}$=0; a swap has occurred and the system will be returned to state 0. Thus, with this prior art arrangement the positive data and negative data are not scrambled independently. Scrambling integrity, that is, first order shaping is not preserved during the zero code crossover resulting in residual distortion tones.

Figures 8A, 8B:
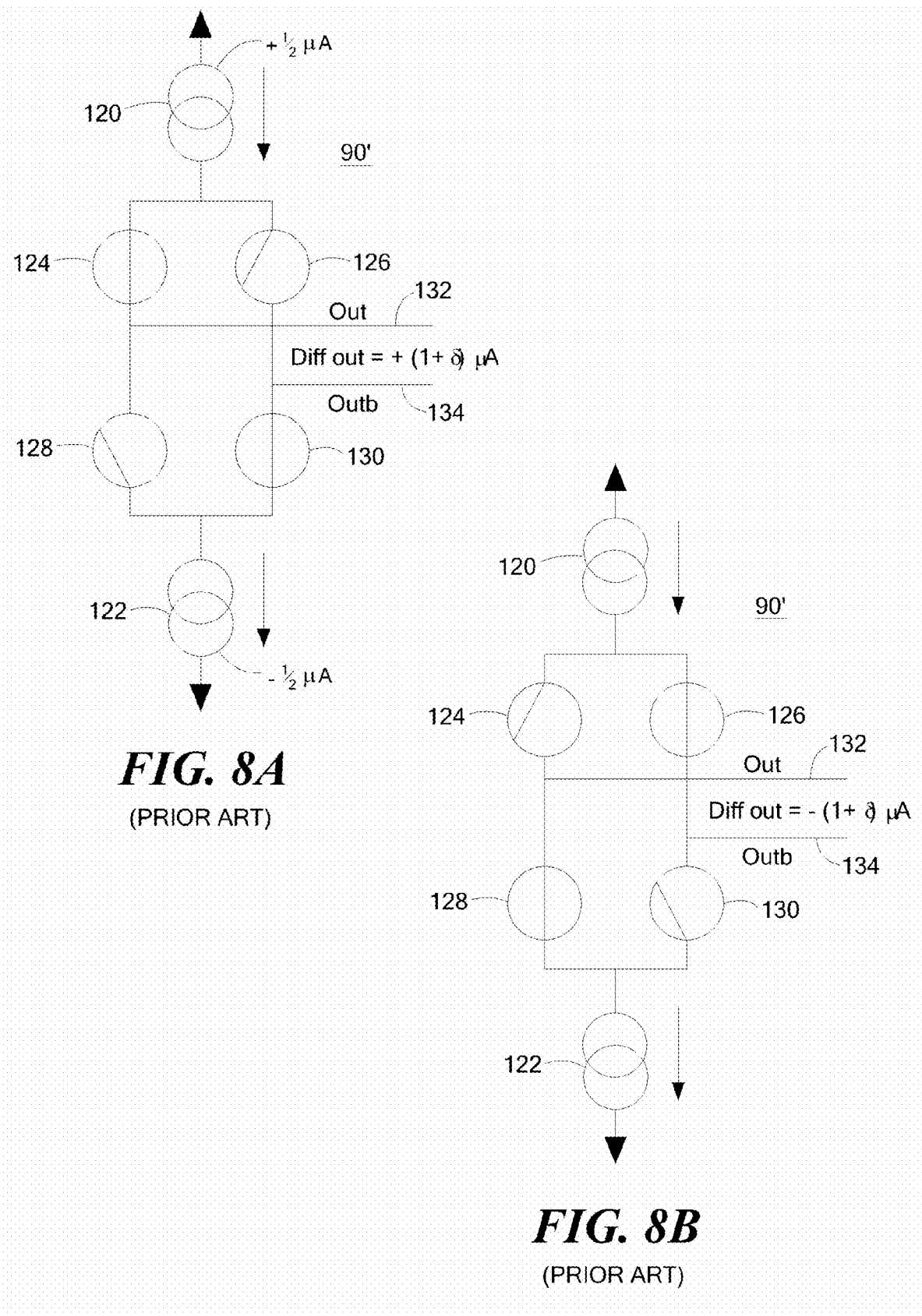
FIGS. 8A and 8B are schematic diagrams of prior art scrambling cells illustrating the error introduced at zero crossover.

The error generation in the prior art may be seen by viewing a cell such as scrambling cell 90, FIG. 6, in more specific detail as shown by scrambling cell 90' in FIGS. 8A and 8B. Scrambling cell 90', FIG. 8A includes two elements, for example, current sources 120 and 122. Current source 120 provides a +½ μa current, and current source 122 provides a −½ μa current. With current sources 120 and 122 perfectly matched and the switches set as shown, switches 124 and 130 closed and switches 126 and 128 open, the differential at outputs 132 and 134 between +½ μa and −½ μa will be 1 μa. Now assuming that current source 120 is mismatched and provides a little more than +½ μa, the differential output will no longer be 1 μa, but it will +(1+δ) μa reflecting an error of δ. This represents operation in the position portion of the cycle. In the negative portion of the cycle demonstrated in FIG. 8B current source 122 still provides −½ μa and current source 120 still provides a little more than +½ μa. Now, however, the switches are set oppositely, that is, switches 124 and 130 are open, switches 126 and 128 are closed. Now −½ μa appears on output 132 but on output 134 we have a little more than +½ μa, therefore the differential output is −(1+δ) μa: the error is the same now in the negative portion of the cycle as it was in the positive portion of the cycle. The errors are not eliminated at zero. Because the elements are reversed the direction of mismatch error is also reversed. Therefore, blind scrambling of the elements means that first order shaping breaks down at zero crossover.

Figure 9:
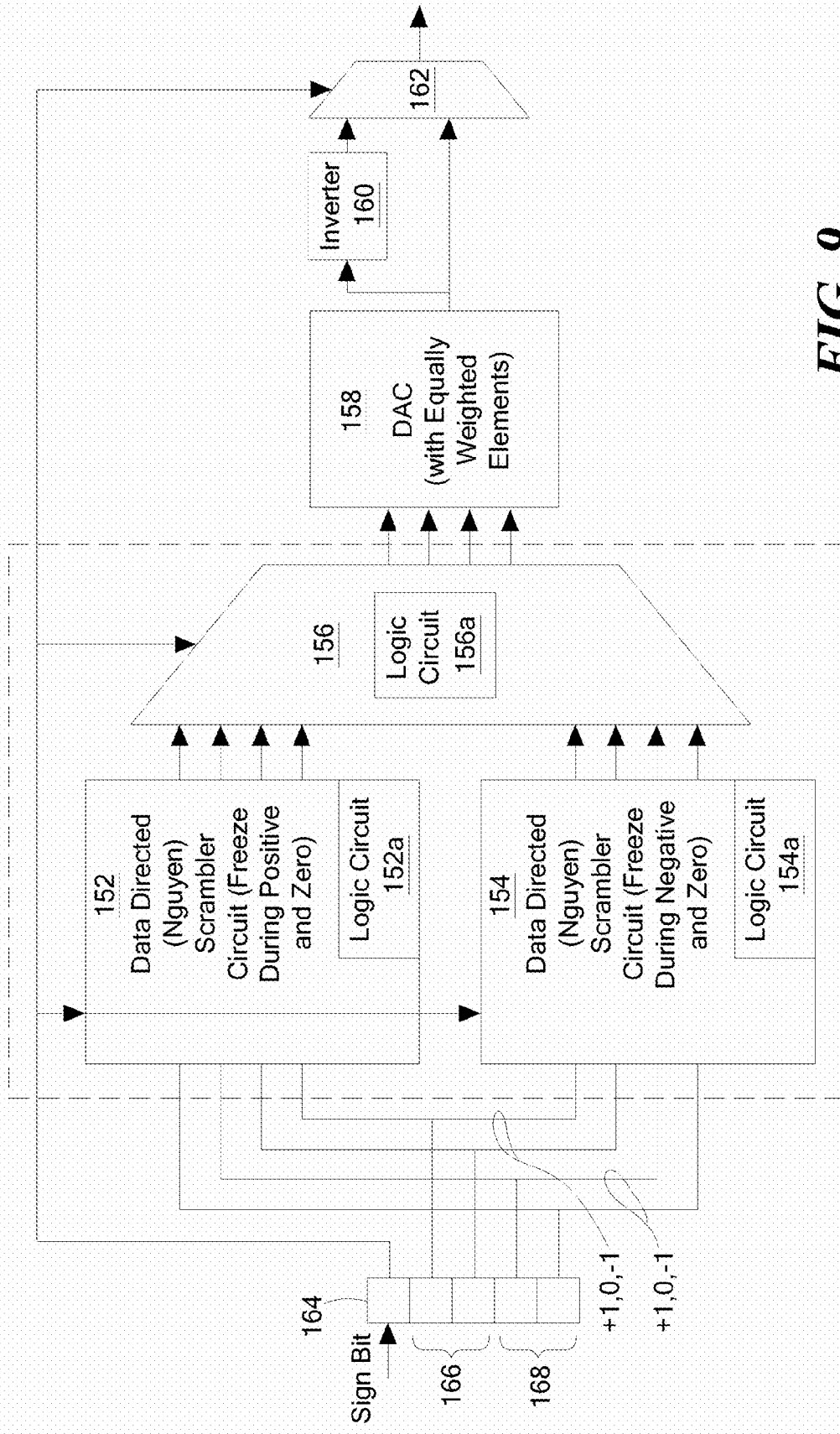
FIG. 9 is a schematic block diagram of one embodiment of a digital to analog converter system with multi-level scrambling according to this invention.

In one embodiment this invention presents a digital to analog converter system 150, FIG. 9. This embodiment uses two data directed scrambler circuits 152 and 154 and a mux or switching circuit 156 which delivers the output of one of those scrambler circuits 152, 154 to DAC circuit 158. The output of DAC 158 is, similarly to the prior art, passed through an inverter 160 and a second output mux or switching circuit 162 is used to select either the output from DAC circuit 158 or its inverted output from inverter 160 depending upon the sign indicated by the sign bit 164 accompanying the tri-level inputs 166 and 168. Each of scrambling circuits 152 and 154 is a data directed scrambler circuit and can be implemented specifically with a Nguyen et al. scrambler circuit as disclosed in Nguyen et al. U.S. Pat. No. 7,079,063B1. Data directed scrambler circuit 152 is set to freeze during positive portions of the input code cycle and at zero code. Data directed scrambler circuit 154 likewise is frozen during the negative portion of the input code cycle and at zero code. Thus, during the negative portion of the input code scrambler circuit 152 scrambles the input code and delivers it to mux 156 which in turn delivers it to DAC circuit 158. At this time, scrambler circuit 154 is frozen and its output is not passed on by mux or switching circuit 156. During the positive portion of the input code cycle scrambler circuit 154 scrambles the input and delivers it to switching circuit 156 which passes it on to DAC circuit 158. During this time scrambler circuit 152 is frozen and its output is not passed on by switching circuit 156. At the zero code point both scrambler circuits 152 and 154 are frozen and no signals are passed by switching circuit 156 to DAC circuit 158 and zero crossover errors are eliminated. Together scrambler circuits 152 and 154 with switching circuit 156 constitute a form of state machine employing internal logic circuits 152a, 154a and 156a.

The result is an innovative zero code cross-over logic configuration as indicated by Table II, FIG. 10, this state machine function operates according to the logic of Table II which has the same columns for input $A_{in}$ 102a, $B_{in}$ 104a, $A_{out}$ 106a, and $B_{out}$ 108a, as Table I, FIG. 7, but in addition it has two additional columns, State P 170 associated with a positive portion of the code cycle and State N 172 associated with the negative portion of the code cycle. In addition new states are developed as shown at New State P and New State N columns 174 and 176. As before, the first three rows 178 contain inputs of 0, 0; +1, +1; or −1, −1, that is, like inputs and they are not swappable so there is no state change. X in Table II represents an indication that it does not matter what state is represented insofar as the logic operation is concerned. The next four rows State 0, 180 again direct that there not be a swap but that the state be advanced. The next four rows 182, state 1, direct the output in the first predetermined order and a return to state 0. That first predetermined order again is always 0, +1, in the positive portion of the cycle and −1, 0 in the negative portion of the cycle. The last four lines 184, state 2, direct that the output be in the second predetermined order which in a positive code portion is +1, 0, and the negative code portion is 0, −1, and then returned to state 0.

In an operation example, let state P be 0 and state N be X indicating it does not matter at this point what the state N is. Then with $A_{in}$ as +1 and $B_{in}$ as 0, $A_{out}$ will be +1 and $B_{out}$ will be 0; that is, there will be no swap. The new state P is 1, the new state N is N. Thus whatever the state was at the beginning of state N remains. The state of N while it is frozen is remembered. Continuing now, the new state P is 1, column 174, and so the system moves to the state 1, 182. There, in the first two rows, state P is 1 and the state of N is X, whatever it was, it is still. The input again is +1 and 0. Now the output is 0, +1, (i.e. a swap) the new state P is 0 and the new state N is still state N, the frozen, remembered state. The system now returns to 0 and again depending upon whether input is $A_{in}$+1, $B_{in}$ 0 or $A_{in}$ 0, $B_{in}$+0 the output will be $A_{out}$+1, $B_{out}$ 0 or $A_{out}$ 0, $B_{out}$+1 respectively, and the new state P will be 2, the new state N is still N. Referring to the first line of state 2, 184, if the inputs $A_{in}$, $B_{in}$ are +1, 0, respectively, then the output $A_{out}$ $B_{out}$ will be +1, 0: no swap. If the input, referring to the second line, is, 0, +1, the output will still be +1, 0: that constitutes a swap. The new state P is now 0, the state N is still state N. When the sign changes this system is cognizant of that and assuming, for example, that the state N, having been frozen or remembered, was state 0 the system would go to either the third or fourth lines of state 0, 180. If the input is $A_{in}$=−1, $B_{in}$=0, it would be the third line; if the input is $A_{in}$=0, $B_{in}$=−1, it would be the fourth line. The outputs $A_{out}$, $B_{out}$ would be −1 and 0 or 0 and −1 and would therefore present no swap. State P would now be in whatever state it was in and it would be frozen or it would remember that state and the new state N would be either 2 or 1, all respectively. Thus, during the operation of one of the scrambler circuits 152, 154 the other one is frozen and its state is remembered so that when the sign bit indicates a change in the input code from positive to negative or negative to positive the currently operating scrambler circuit will be frozen and the frozen one will be reactivated and will begin in the state in which it was last remembered. Thus the positive data and negative data in accordance with this invention are scrambled independently. The scrambling integrity therefore, that is, the first order shaping, is preserved during the zero code crossover and residual distortion tones are reduced or eliminated.

Figure 11:
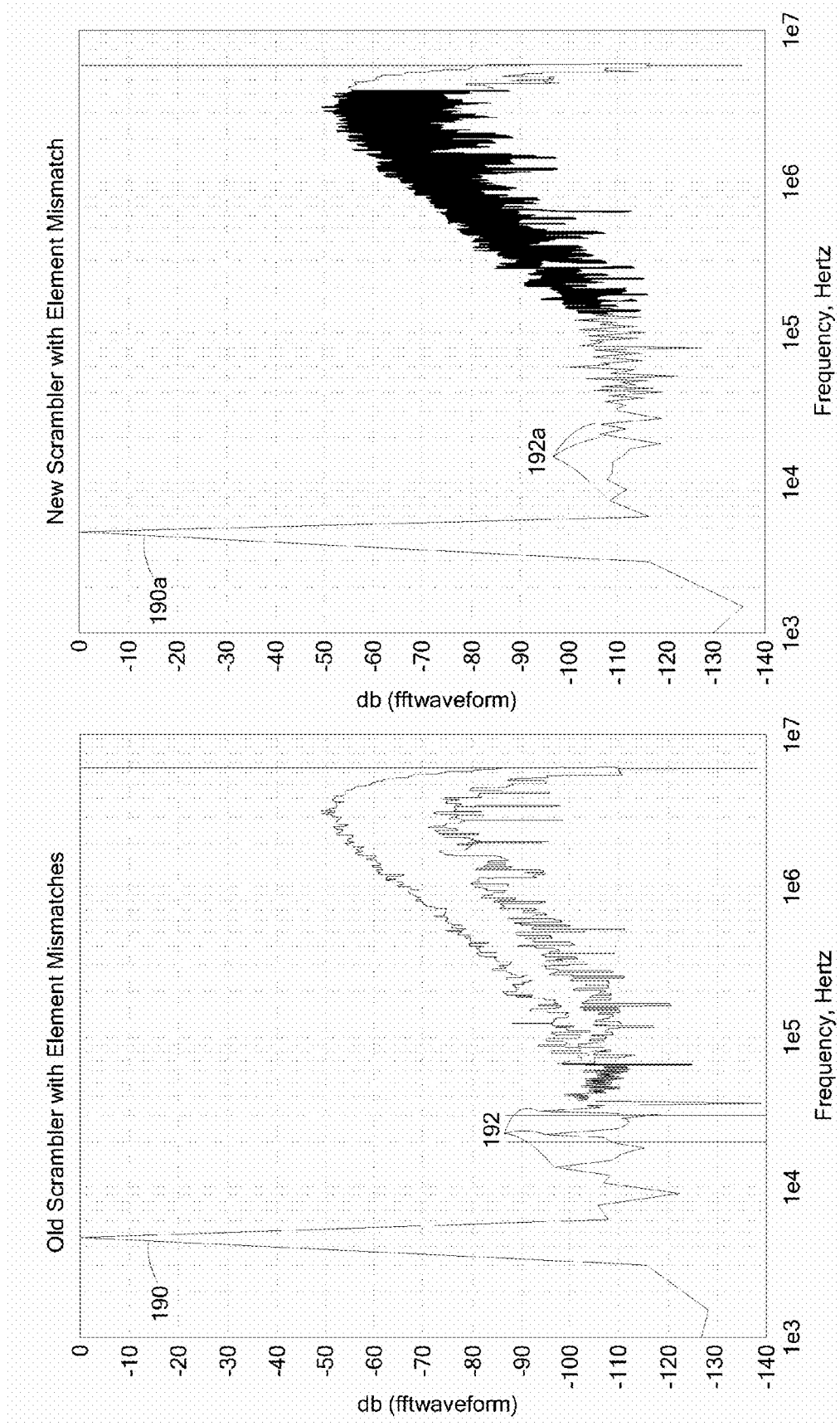
FIG. 11 illustrates the comparative in-band noise reduction effected by this invention.

The efficacy of this invention is demonstrated in part in FIG. 11, where the signal 190 in prior art scramblers has associated with it harmonic distortions 192, whereas with respect to the signal 190*a* produced by this invention the distortions 192*a* are reduced or eliminated.

Figure 12:
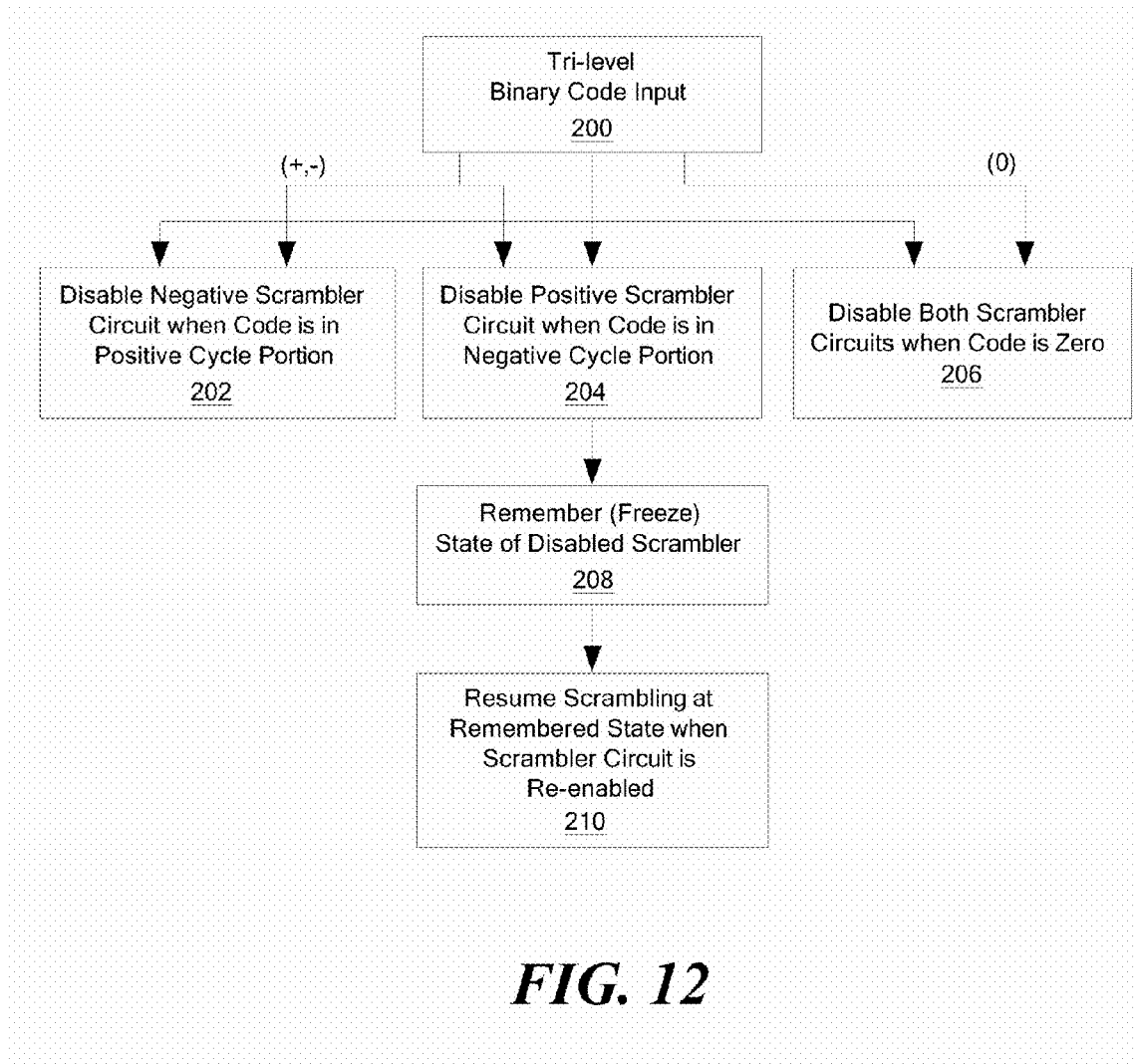
FIG. 12 is a flow chart illustrating one embodiment of the method of this invention.

This invention also includes a method of tri-level scrambling for a digital to analog converter system which responds to a tri-level binary code input 200, FIG. 12. Cognizant of the sign be it + or −, either the negative scrambler circuit is disabled 202 during the positive portion of the code cycle or the positive scrambler circuit is disabled 204 during the negative portion of the code cycle. At zero code both scrambler circuits are disabled 206. The state of the disabled scrambler is frozen and remembered 208 and when that scrambler is re-enabled it resumes scrambling at that remembered state 210, in this way avoiding the zero crossover and errors that result therefrom.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A digital to analog converter system with tri-level scrambling comprising: a tri-level scrambler system including a negative data directed scrambler circuit and a positive data directed scrambler circuit and configured to respond to a tri-level binary code input for disabling said negative scrambler circuit when the input code is in a positive cycle portion, disabling said positive scrambler circuit when the input code is in a negative cycle portion and disabling both scrambler circuits upon a zero input code for reducing low level distortion due to a reversal of current during crossover between those cycles.

2. The digital to analog converter system of claim 1 in further including a digital to analog converter.

3. The digital to analog converter system of claim 2 in which said scrambler system includes a scrambler switching circuit responsive to said input code for passing said negative scrambler circuit output to said digital to analog converter during the negative code cycle portion and blocking said positive scrambler circuit output and passing said positive scrambler circuit output to said digital to analog converter during the positive code cycle portion and blocking said negative scrambler circuit output and blocking both scrambler circuit outputs at zero code.

4. The digital to analog converter system of claim 2 further including an inverter circuit connected to the output of said digital to analog converter and an output switching circuit responsive to said input code for selectively transmitting the output of said inverter circuit and said digital to analog converter in response to the input code being in the negative or positive cycle portion, respectively.

5. The digital to analog converter system of claim 2 in which said digital to analog converter includes a $\Sigma\Delta$ modulator with equally weighted elements.

6. The digital to analog converter system of claim 1 in which said scrambler system is further configured to remember the state of a disabled scrambler circuit and resume at that state when that scrambler circuit is re-enabled.

7. The digital to analog converter system of claim 1 in which said scrambler system includes a state machine which operates according to the zero code cross-over logic set forth in Table II, FIG. 10.

8. A method of tri-level scrambling in a digital to analog converter system comprising: in response to a tri-level binary code input, disabling a negative data directed scrambler circuit when the input code is in a positive cycle portion; disabling a positive data directed scrambler circuit when the input code is in a negative cycle portion; and disabling both scrambler circuits upon a zero input code for reducing low level distortion due to a reversal of current during crossover between those cycles.

9. The method of tri-level scrambling of claim 8 further including remembering the state of a disabled scrambler circuit and ensuring scrambling at that state when that scrambler circuit is re-enabled.

* * * * *